(12) United States Patent
Wytman et al.

(10) Patent No.: US 6,354,791 B1
(45) Date of Patent: *Mar. 12, 2002

(54) WATER LIFT MECHANISM WITH ELECTROSTATIC PICKUP AND METHOD FOR TRANSFERRING A WORKPIECE

(75) Inventors: Joe Wytman, Los Gatos, CA (US); Ivo Raaijmakers, Phoenix, AZ (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/835,972

(22) Filed: Apr. 11, 1997

(51) Int. Cl.[7] .................................................. B25J 15/00
(52) U.S. Cl. ................. 414/744.3; 294/65.5; 414/744.5; 414/800; 901/40
(58) Field of Search ........................... 414/744.3, 744.5, 414/737, 800, 806, 808, 937; 901/40; 335/289, 296, 297; 294/902, 86.4, 65.5, 1.1

(56) References Cited

U.S. PATENT DOCUMENTS

| | | | |
|---|---|---|---|
| 3,993,509 A | * 11/1976 | McGinty | 335/289 X |
| 4,501,527 A | * 2/1985 | Jacoby et al. | 414/744.3 X |
| 4,770,590 A | 9/1988 | Hugues et al. | 414/172 |
| 5,000,652 A | 3/1991 | Christensen | 414/744.3 |
| 5,160,238 A | * 11/1992 | Kambara | 414/744.3 X |
| 5,178,512 A | * 1/1993 | Skrobak | 414/744.3 X |
| 5,445,491 A | * 8/1995 | Nakagawa | 414/937 X |
| 5,459,632 A | 10/1995 | Birang | 361/234 |
| 5,571,325 A | * 11/1996 | Ueyama | 414/217 X |
| 5,720,590 A | * 2/1998 | Hefmeister | 414/744.2 |

FOREIGN PATENT DOCUMENTS

| | | |
|---|---|---|
| FR | 2633863 | 2/1990 |
| JP | 3263350 | 11/1991 |
| JP | 5146984 | 6/1993 |
| JP | 6151562 | 5/1994 |
| JP | 6318628 | 11/1994 |

* cited by examiner

*Primary Examiner*—Donald W. Underwood
(74) *Attorney, Agent, or Firm*—Fulbright & Jaworski L.L.P.

(57) ABSTRACT

A method and apparatus for transferring a semiconductor wafer in both a theta axis and a z-axis is provided. The apparatus is able to maintain maximum process and wafer throughput while minimizing the footprint of the processing machine by utilizing the concept of "vertical integration" to maximize the use of process slots and minimize the machine foot print. The wafer lift apparatus includes a bipolar electrostatic pick-up for engaging the article at an off-center position near an edge thereof. The electrostatic pick-up is positioned near one end of a transfer arm, the other end of the transfer arm being connected to a drive means for rotating the transfer arm and electrostatic pick-up in the theta axis, or vertically moving the transfer arm and electrostatic pick-up in the z-axis. The electrostatic pick-up is preferably connected to a power source by inductive coupling. According to the method of the present invention, the electrostatic pick-up is positioned beneath the wafer at an off-center position, lifted to contact a lower surface of the wafer, and energized to create an attractive force upon the wafer. The wafer is then lifted and rotated to remove the wafer from the end effector. Finally, the wafer is lifted to a pre/post processing plane located above the processing plane.

20 Claims, 4 Drawing Sheets

WAFER LIFT MECHANISM WITH ELECTROSTATIC PICKUP AND METHOD FOR TRANSFERRING A WORKPIECE

BACKGROUND OF THE INVENTION

The present invention relates to the transfer of articles, such as semiconductor wafers, and more particularly to a vertically integrated processing system and a method and apparatus for transferring semiconductor wafers in such a vertically integrated system.

In semiconductor substrate or wafer processing, electrostatic chucks (E-chucks) are typically used to maintain a wafer in position on a pedestal (or other wafer support) during wafer processes such as sputtering, other physical vapor deposition (PVD) processes, chemical vapor deposition (CVD) processes, etching, or ion implantation. The E-chuck replaces prior art clamping rings, which are placed about the periphery of the wafer to hold it down on the pedestal. An advantage of the E-chuck over a clamping ring is that it does not create the stresses caused by the clamp ring engaging and putting pressure on the edges of the wafer, and it does not overhang the wafer edge and thereby reduce the real estate on the wafer available for deposition as is caused by the inner perimeter of the clamping ring overhanging the wafer.

A typical wafer processing apparatus includes one or more central transfer chambers surrounded by a number of pre-processing, processing and post-processing chambers located on the same processing plane. A critical consideration in semiconductor wafer processing is the footprint of the processing apparatus. During processing, the machines must normally be located in a clean room, which can cost upwards of several thousand dollars per square foot. This is a particular concern in machines designed to process 12" (300 mm) wafers. Therefore, there exists a need for a semiconductor processing apparatus that can maintain maximum process and wafer throughput while maintaining as small a foot print as possible.

SUMMARY OF THE INVENTION

The present invention is an apparatus and method for transferring an article, such as a semiconductor wafer, in both a theta axis and a z-axis, to maintain maximum process and wafer throughput, while minimizing the footprint of the processing machine. The invention utilizes the concept of "vertical integration" to maximize the use of process slots and minimize the machine foot print.

According to one aspect of the present invention, an apparatus is provided for transferring an article both in a z-axis and a theta axis. The apparatus according to this aspect of the invention comprises an electrostatic pick-up for engaging the article, preferably at an off-center underside position near an edge thereof; a transfer arm, with the electrostatic pick-up positioned near a first end and on an upper surface thereof; and drive means for rotating the transfer arm in the theta axis, and thereby swing the electrostatic pick-up through an arc, or for vertically moving the transfer arm and electrostatic pick-up in the z-axis. The electrostatic chuck is preferably a bipolar electrostatic pick-up and is preferably comprised of either a ceramic based material or polyamide. The electrostatic chuck may be connected to a power source by inductive coupling. The drive means may include a drive shaft connected to a second end of the transfer arm; a vertical actuator connected to the drive shaft for providing movement in the z-axis; a magnetic rotary actuator connected to the drive shaft for providing movement in the theta axis; and a rotatable bellows assembly surrounding the drive shaft and separating atmosphere within the bellows assembly from an external vacuum environment. The vertical actuator may be either an air actuator, or an electro-mechanical actuator coupled to a lead screw on the drive shaft. Alternatively, the drive means may include a drive shaft connected to a second end of the transfer arm; an actuator connected to said drive shaft for providing linear movement in the z-axis and rotary movement in the theta axis; and a bellows assembly, with a sealed rotary connection therethrough, surrounding said drive shaft and separating atmosphere within the bellows assembly from an external vacuum environment.

According to another aspect of the invention, provided is an apparatus for processing semiconductor wafers comprising a central transfer chamber having a wafer transfer robot therein for transferring wafers on a processing plane; a plurality of process chambers surrounding and connected to the central transfer chamber on the processing plane; a pre/post processing chamber located above the transfer chamber on a pre/post processing plane; and a wafer transfer device for engaging the semiconductor wafer at an off-center position and transferring the wafer between the robot in the processing plane and the pre/post processing chamber in the pre/post processing plane. The wafer transfer device may include a bipolar electrostatic pick-up for engaging the semiconductor wafer at an off-center position near an edge thereof; a transfer arm, with the electrostatic pick-up being positioned near a first end and on an upper surface thereof; and drive means for rotating the transfer arm and electrostatic pick-up in the theta axis, or vertically moving the transfer arm and electrostatic pick-up in the z-axis.

A third aspect of the present invention is a method for transferring an article, i.e. a semiconductor wafer, both in a z-axis and a theta axis. The method according to this aspect of the invention comprises the steps of engaging the article with an electrostatic pick-up at an off-center position near an edge thereof; rotating a transfer arm carrying said electrostatic pick-up in the theta axis; and vertically moving the article carried by the transfer arm and electrostatic pick-up in the z-axis. The step of vertically moving the article may include raising the article from a processing plane to a pre/post processing plane. Furthermore, the step of engaging the article may include positioning the electrostatic pick-up below the article; rotating the transfer arm to position the electrostatic pick-up at a point below and off-center of the article; raising the electrostatic pick-up to contact a lower surface of the article at an off-center position near the edge thereof; and energizing the electrostatic pick-up to create an attraction force on the article. The article is preferably a semiconductor wafer, which may be transferred from an end effector located within a vacuum chamber to a pre/post processing chamber located above the vacuum chamber.

These and other features, aspects and advantages of the present invention will become better understood by referring to the following detailed description, drawings and claims, wherein examples of the presently preferred embodiments are given for purposes of illustration and disclosure.

DETAILED DESCRIPTION

Figure 1:
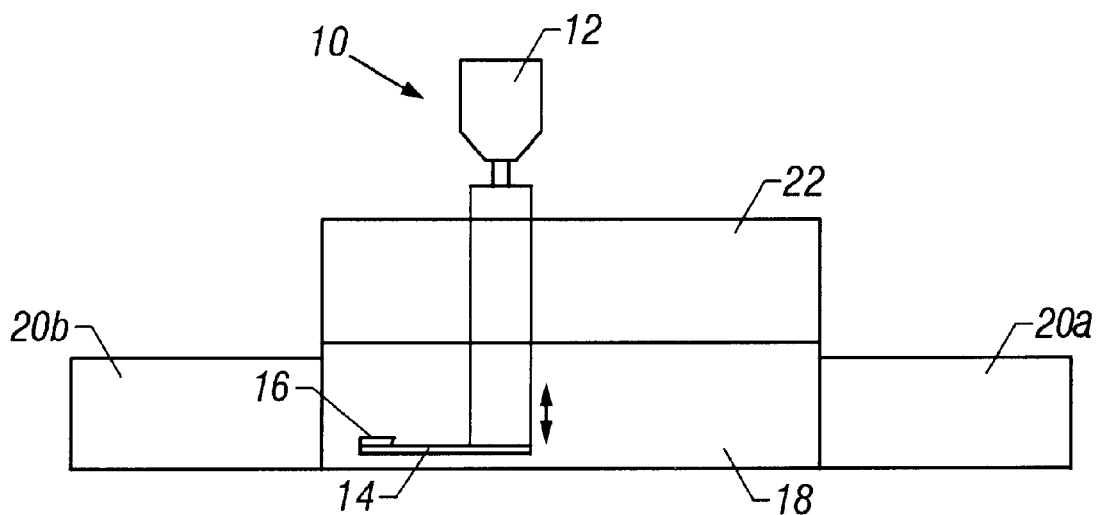
FIG. 1 is a side schematic view of a wafer lift system according to an embodiment of the present invention.

The present invention is best understood by referring to the Drawings in connection with review of this Description. The present invention is an apparatus and method for transferring an article, such as a semiconductor wafer, in both a theta axis and a z-axis. The present invention also concerns an apparatus for processing semiconductor wafers including a wafer lift/transfer device for vertically transporting a wafer between a processing plane and a pre/post processing plane. The use of the electrostatic pick-up lifting apparatus of the present invention facilitates the transfer of large wafers from the processing plane to what is the expected area for pre and post processing of the wafers, with minimal footprint of the lifting device and minimal particle generating contact between the substrate and the lifting mechanism. In order to reduce the footprint of the processing apparatus, the pre and post process chambers, including load lock chambers for the introduction and/or removal of wafers from the processing system, preheat chambers, orient chambers and degas chambers among others, are preferably mounted to a separate transfer chamber located above (or below) the main frame-robot transfer chamber thereby freeing up positions around the first transfer chamber for additional processing chambers.

The wafer lift/transfer device of the present invention is necessary to transfer wafers between the robot end effector and the second level processing plane which is used for pre and post processing operations. The use of an electrostatic pick-up in the apparatus permits off-axis transfer of the wafers which minimizes difficulties associated with wafer transfer. The wafer transfer system of the present invention encompasses a multitude of other process applications where off-axis wafer transfer would be advantageous.

FIG. 1 shows one preferred embodiment of a wafer lift system according to the present invention, included in a dual level multichamber wafer processing system. The wafer lift system includes a wafer lift mechanism 10 exhibiting a drive mechanism 12, a transfer arm 14 and an electrostatic pick-up 16. The transfer arm 14 and electrostatic pick-up 16 are shown positioned within a central transfer chamber 18 of a dual level, multichamber, semiconductor wafer processing apparatus. A plurality of process chambers 20a, 20b surround a first transfer chamber 18, and a pre/post processing transfer chamber 22 is located above the transfer chamber 18, to which load lock and other pre/process chambers are linked, such as preheat, orient, degas, etc.

Figure 2:
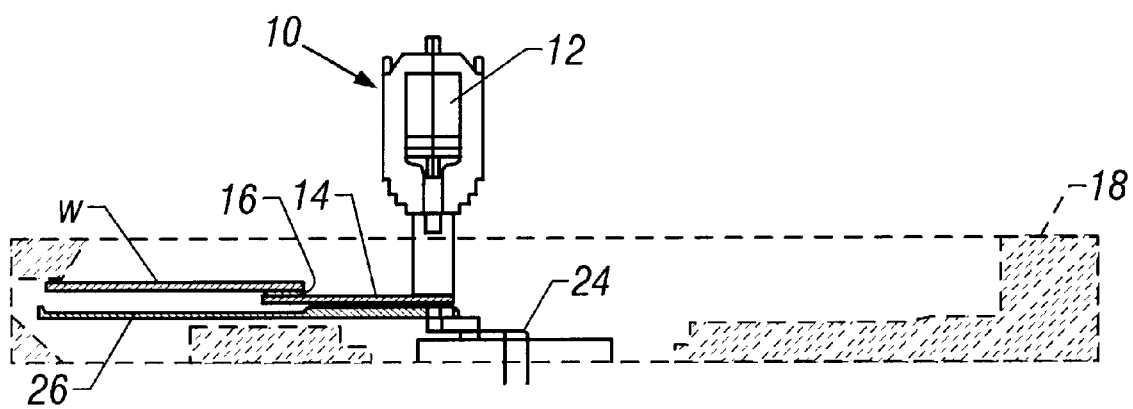
FIG. 2 is a side sectional view of an electrostatic pick-up wafer lift mechanism according to an embodiment of the present invention, shown in a transfer chamber of a semiconductor processing apparatus.
Figure 3:
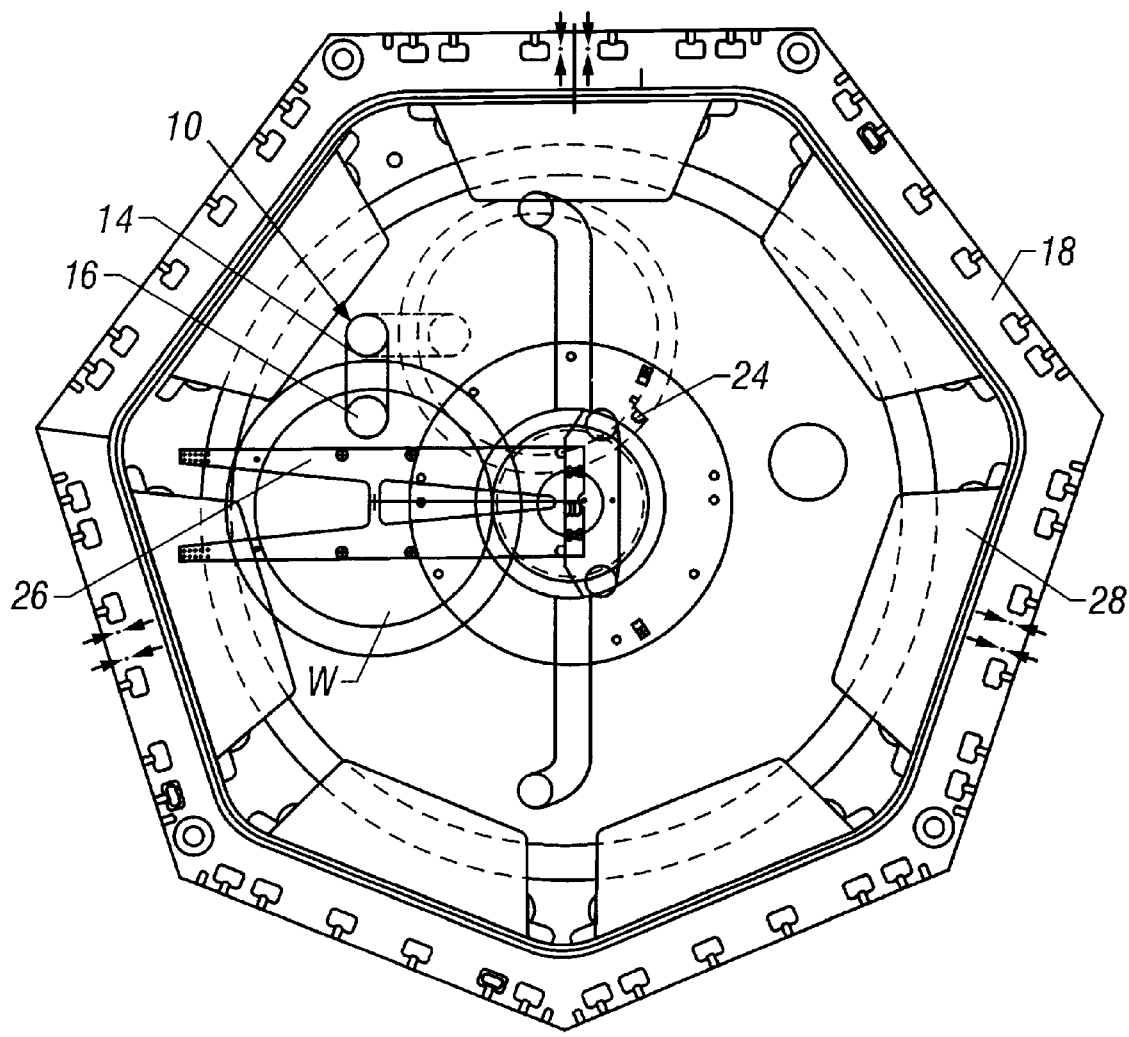
FIG. 3 is a top sectional view of the electrostatic pick-up wafer lift mechanism shown in FIG. 2.

Referring to FIGS. 2 and 3, a wafer transfer robot 24 is shown positioned within the central transfer chamber 18 for transferring wafers W carried on an end effector 26 of a robot through the transfer chamber to place and remove the wafers W from process chambers connected thereto, such as process chambers 20a and 20b, through slit valves 28. In operation, to remove a wafer from the transfer chamber, the electrostatic pick-up 16 engages a semiconductor wafer W held on the end effector 26 from below at an off-center position near an edge thereof (FIG. 3), and the drive mechanism 12 then causes the electrostatic pick-up 16 and transfer arm 14 to lift slightly and rotate, thus removing the wafer W from the robot end effector 26 to the position shown in phantom in FIG. 3. Once removed from the end effector 26, the wafer W is lifted into the upper transfer chamber 22 where it may be placed on an additional robot for placement into a load lock for removal from the processing system. Because the electrostatic pick-up engages the wafer near an edge thereof, movement of the end effector is not inhibited while the wafer is being lifted to the upper transfer chamber. Consequently, once the wafer is lifted off the end effector, the end effector may be moved to pick up another wafer for processing.

The drive mechanism continues to raise the wafer through a valved opening in the upper wall of the transfer chamber 18 into the pre/post processing chamber 22. Once the wafer has been transferred to the plane of the pre/post processing transfer chamber, it is placed on a support within the pre/post processing chamber 22. Preferably, the support is an additional end effector of an additional robot located in the pre/post processing transfer chamber.

An example of one type of pre/post processing operation that can be carried out in the pre/post processing chamber is wafer de-gas, which preferably may be accomplished by placing the wafers on a rotary table positioned within the pre/post processing chamber 22. The rotary table slowly rotates while wafers are positioned thereon. The de-gas continues while the table rotates, and once a wafer has completed the de-gas process, it is picked up by the wafer transfer system of the present invention and returned to the processing plane. Alternatively, a pre-clean process may be carried out in the pre/post processing chamber 22. In the pre-clean process, a pedestal is raised within the chamber and the wafer is positioned on the pedestal for pre-cleaning. The wafer lift mechanism carrying the wafer is then rotated to place the wafer on the pedestal for pre-cleaning.

Another possibility includes positioning of a transfer robot having an end effector within the pre/post processing chamber 22. The robot end effector would remove the wafer from the electrostatic pick-up and transfer it to an adjacent pre or post processing chamber. In this way, a plurality of processing planes, each having a central transfer chamber surrounded by a plurality of processing chambers, may be stacked upon one another. The end effector is typically a blade having a length which exceeds the diameter of the wafer and a width which is less than the wafer diameter. Thus, the underside of the wafer is exposed to either side of the blade, providing a location for positioning of the electrostatic lifting device of the present invention.

The electrostatic pick-up 16 is preferably a bipolar electrostatic pick-up. A simple capacitor including two conducting electrodes separated by an insulating dielectric material may be used to create a charged field which attracts and holds a wafer which is placed over or on the electrodes. The dielectric material determines many critical pick-up performance factors, including clamping strength, release time, operating voltage, heat transfer, abrasion resistance and reliability. A variety of dielectric materials, such as ceramics, metal oxides such as aluminum oxide, and polyamides may be utilized. The preferred dielectric material for the present invention is a low temperature insulating material that creates a high pick-up force on the wafer.

The size of the electrostatic pick-up is largely dependent upon the dielectric material used and the diameter of the wafer to be transferred. Because the wafer is picked up at an off-center position (i.e., to the side of the end effector), a large moment arm is created which tends to want to cock the wafer on the lifter surface. If the wafer begins lifting off one edge of the lifter, the pick-up force will decrease as the space between the wafer and lifter edge increases, resulting in a loss of pick-up force and a dropped wafer. Therefore, a high pick-up force is required to maintain a hold on the wafer. Ceramic based pick-ups typically provide a greater pick-up force than polyamide chucks, and therefore are generally preferred. Where a ceramic based material is used for the dielectric in the electrostatic pick-up the electrostatic pick-up diameter generally must be between at least 15%–30% of the diameter of the wafer to be transferred. For example, to effect an off-axis transfer of a 12" (300 mm) semiconductor wafer, the electrostatic pick-up should exhibit a diameter of between about 2 and 4 inches. For a 6" or 8" semiconductor wafer, a ceramic based electrostatic pick-up having a diameter of between about 1 and 3 inches may be used, with a preferred diameter being approximately 1.5 inches. Where a polyamide material is used for the dielectric in the electrostatic pick-up, the electrostatic pick-up diameter generally must be approximately 50% of the diameter of the wafer to be transferred. Thus, to effect an off-axis transfer of a 12" (300 mm) semiconductor wafer, the polyamide electrostatic pick-up should exhibit a diameter of about 6 inches. For a 6" or 8" semiconductor wafer, a polyamide electrostatic pick-up having a diameter of approximately 3 to 4 inches may be used.

Figure 4:
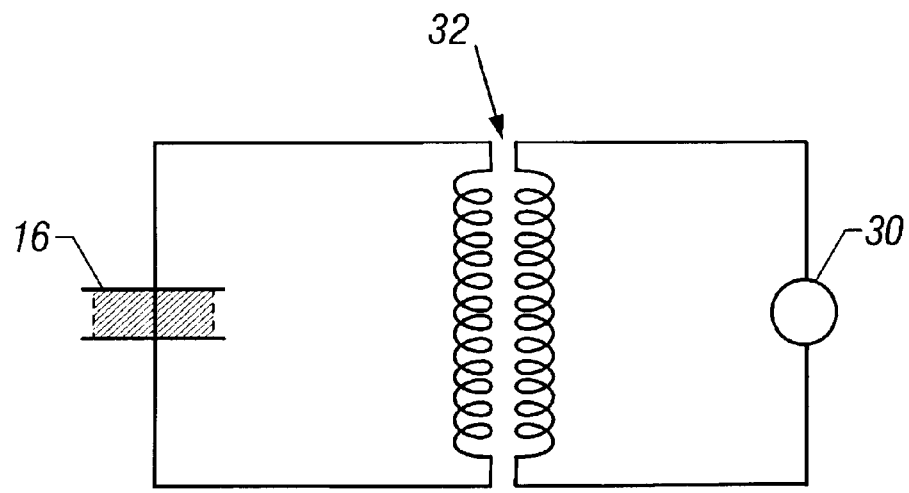
FIG. 4 is a side sectional view of a portion of the electrostatic pick-up wafer lift mechanism shown in FIG. 2.

As shown in FIG. 4, a high voltage power supply 30 is required to create the required charged field in the electrostatic pick-up. Various types of power supplies, such as AC, DC, square wave, chopped wave and sine wave can be used to provide a charge of at least 1000 volts at a current of about 300 micro-amps to the electrostatic pick-up. The power supply 30 is preferably connected to the electrostatic pick-up by an inductive coupling 32. Inductive coupling is the preferred connection in the present invention due to the high voltage and low current supplied by the power supply. The inductive coupling is also desirable because it permits the electrostatic pick-up and the transfer arm to rotate a full 360° without tangling of wires that would occur with a hard wired connection between the electrostatic pick-up electrode 2 and power supply.

Figure 5:
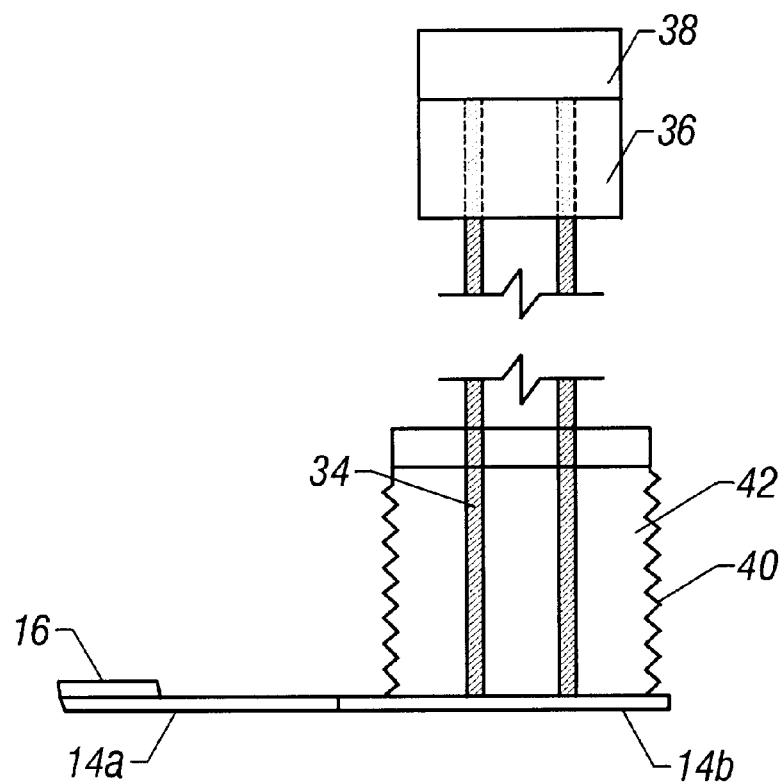
FIG. 5 is a schematic view of the power supply for the electrostatic pick-up according to an embodiment of the present invention.

As best shown in FIG. 5, the transfer arm 14 includes a first segment 14a formed of an insulating material such as alumina or ceramic, and a second segment 14b formed of a conductive material such as titanium or stainless steel. The first segment 14a may be connected to the second segment 14b by any conventional means, such as bonding or with the use of fasteners such as bolts.

The lift assembly 10 further includes a drive shaft 34 connected to the transfer arm 14 at a lower end thereof. An upper end of the drive shaft 34 is connected to a drive motor, or vertical actuator 36, which provides vertical movement in the z-axis. A rotary actuator 38, such as a magnetic motor, is also connected to the drive shaft 34 for providing rotary movement in the theta axis. A rotatable bellows assembly 40 surrounds the drive shaft separating the atmosphere 42 within the bellows assembly 40 from the vacuum environment of the transfer chamber. Alternatively, a single actuator may provide both rotary and vertical movement.

Figure 6A:
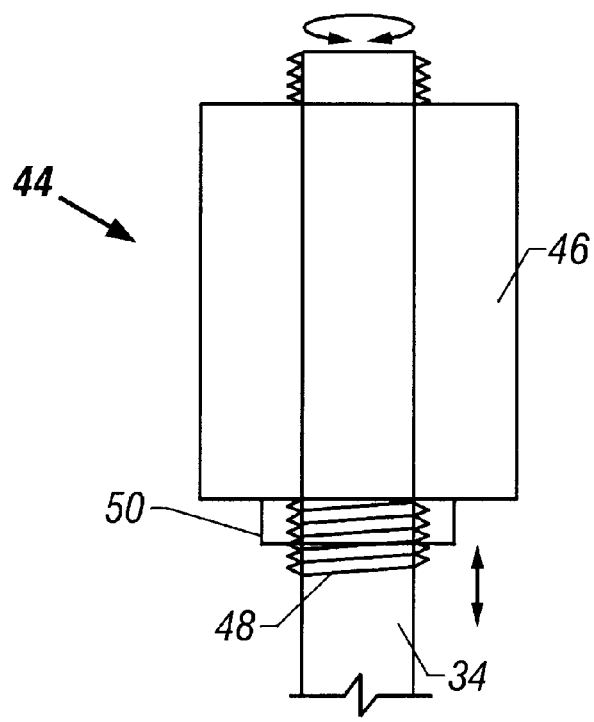
FIG. 6A is a side sectional view of a drive mechanism according to one embodiment of the present invention.

As shown in FIG. 6A, the vertical actuator may be an electro-mechanical actuator 44. The electromechanical actuator includes a motor 46 through which a lead screw 48 formed in a section of the drive shaft 34 passes. The lead screw 48 is rotatably driven by the motor 46 and threadably engages a drive nut 50. As drive motor 46 and drive nut 50 rotate, the drive shaft 34 moves upwardly or downwardly along its longitudinal or z-axis, depending upon the direction of rotation, thereby causing corresponding upward or downward movement of the electrostatic pick-up 16, which is carried by the transfer arm 14.

Figure 6B:
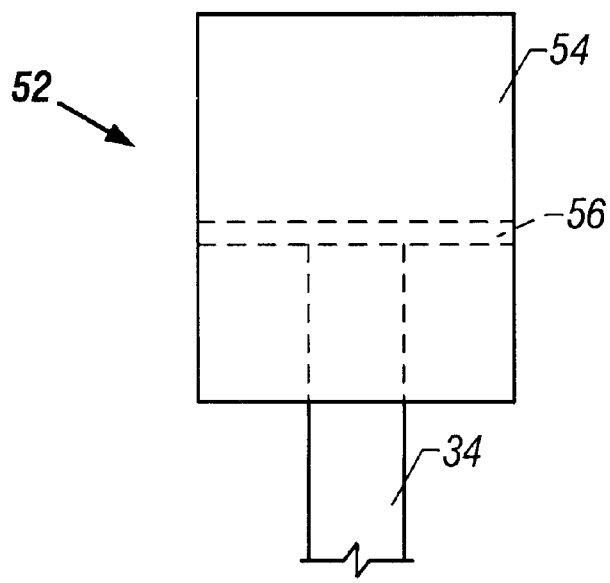
FIG. 6B is a side sectional view of a drive mechanism according to an alternative embodiment of the present invention.

Alternatively, as shown in FIG. 6B, the vertical actuator may be an air actuator including an air cylinder 48 and ram 50. The ram 56 may be directly connected to the upper end of the shaft 34 to provide vertical movement of the transfer arm 14 and electrostatic pick-up 16.

In operation, a semiconductor wafer is transferred between a processing plane and a pre/post processing plane by first engaging the article with an electrostatic pick-up at an off-center position near an edge thereof. This is done by rotating the transfer arm to position the electrostatic pick-up at a point below and off-center of the wafer, raising the electrostatic pick-up to contact a lower surface of the wafer at the off-center position near the edge thereof, and energizing the electrostatic pick-up to create an attraction force on the wafer. Once the wafer is captured on the electrostatic pick-up, it is raised slightly and removed from the end effector. The assembly is then rotated in the theta axis. The wafer is then vertically moved in the z-axis from the processing plane located in the transfer chamber to the pre/post processing plane located in the pre/post processing chamber, which is preferably located above the transfer chamber. Movement from the pre/post processing plane to the processing plane is effected in a similar manner.

The present invention, therefore, is well adapted to carry out the objects and attain the ends and advantages mentioned as well as others inherent therein. While presently preferred embodiments of the invention are given for the purpose of disclosure, numerous changes in the details will readily suggest themselves to those skilled in the art and which are encompassed within the spirit of the invention and the scope of the appended claims.

We claim:

1. An apparatus for transferring a substrate in both longitudinal and arcuate motions comprising:

an electrostatic pickup for engaging the substrate at an off-center position near an edge thereof;

a transfer arm, said electrostatic pickup positioned near a first end of said transfer arm on an upper surface thereof; and drive means for rotating one end of said transfer arm and thereby sweep said electrostatic pickup in an arc, and vertically moving the transfer arm and electrostatic pickup in a longitudinal direction.

2. The apparatus for transferring a substrate according to claim 1, wherein said electrostatic pickup is a bipolar electrostatic pickup.

3. The apparatus for transferring a substrate according to claim 1, wherein said drive means comprises:

a drive shaft connected to a second end of said transfer arm;

a vertical actuator connected to said drive shaft for providing movement in the z-axis;

a magnetic rotary actuator connected to said drive shaft for providing movement in the theta axis; and a rotatable bellows assembly surrounding said drive shaft and separating atmosphere within the bellows assembly from an external vacuum environment.

4. The apparatus for transferring a substrate according to claim 3, wherein said vertical actuator comprises an air actuator.

5. The apparatus for transferring a substrate according to claim 3, wherein said vertical actuator comprises an electromechanical actuator and said drive shaft exhibits a lead screw segment.

6. The apparatus for transferring a substrate according to claim 1, wherein said drive means comprises:
   a drive shaft connected to a second end of said transfer arm;
   an actuator connected to said drive shaft for providing linear movement in the z-axis and rotary movement in the theta axis; and
   a rotatable bellows assembly surrounding said drive shaft and separating atmosphere within the bellows assembly from an external vacuum environment.

7. An apparatus for transferring a semiconductor wafer from an end effector located within a vacuum chamber to a pre/post processing chamber located above the vacuum chamber comprising:
   a bipolar electrostatic pickup for engaging the semiconductor wafer at an off-center position near an edge thereof;
   a transfer arm, said electrostatic pickup positioned near a first end of said transfer arm on an upper surface thereof; and
   a linear lift and rotary drive mechanism connected to a second end of the transfer arm for rotating the transfer arm and electrostatic pickup in a theta axis and vertically moving the transfer arm and electrostatic pickup in a z-axis.

8. An apparatus for processing semiconductor wafers comprising:
   a central transfer chamber having a wafer transfer robot therein for transferring wafers on a first processing plane;
   a plurality of process chambers surrounding and connected to said central transfer chamber on said processing plane;
   a pre/post processing transfer chamber located above said central transfer chamber, the pre-post processing transfer chamber for transferring wafers on a pre/post processing plane;
   a wafer transfer device for engaging the semiconductor wafer at an off-center position and transferring the wafer between the robot in the first processing plane and the pre/post processing transfer chamber, wherein said central and pre/post transfer chambers may be sealed from one another;
   said wafer transfer device comprises:
      a bipolar electrostatic pickup for engaging the semiconductor wafer at an off-center position near an edge thereof;
      a transfer arm, said electrostatic pickup positioned near a first end of said transfer arm on an upper surface thereof; and
      drive means for rotating the transfer arm and electrostatic pickup in the theta axis, or vertically moving the transfer arm and electrostatic pickup in the z-axis.

9. A method for transferring an article both in a z-axis and a theta axis comprising:
   engaging the article with an electrostatic pickup at an off-center position near an edge thereof;
   rotating a transfer arm carrying said electrostatic pickup in the theta axis; and
   vertically moving the article carried by the transfer arm and electrostatic pickup in the z-axis.

10. The method for transferring an article according to claim 9, wherein said article is a semiconductor wafer and said step of vertically moving the semiconductor comprises raising the semiconductor from a processing plane to a pre/post processing plane.

11. The method of transferring an article according to claim 9, wherein the step of engaging the article comprises
   positioning the electrostatic pickup below the article;
   rotating the transfer arm to position the electrostatic pickup at a point below and off-center of the article;
   raising the electrostatic pickup to contact a lower surface of the article at an off-center position near the edge thereof; and
   energizing the electrostatic pickup to create an attraction force on the article.

12. A method for transferring a semiconductor wafer from an end effector located within a vacuum chamber to a pre/post processing transfer chamber located above the vacuum chamber comprising:
   positioning an electrostatic pickup carried on a transfer arm below the semiconductor wafer;
   rotating the arm to position the electrostatic pickup at a point below and off-center of the semiconductor wafer;
   raising the electrostatic pickup to contact a lower surface of the semiconductor wafer at an off-center position near the edge thereof; and
   energizing the electrostatic pickup to create and attraction force on the article;
   rotating the transfer arm carrying said electrostatic pickup in the theta axis; and
   raising the semiconductor from a processing plane located within the vacuum chamber to a pre/post processing plane located within the pre/post processing transfer chamber, wherein the pre/post processing transfer chamber is located above and sealably separable from the vacuum chamber.

13. An apparatus for transferring a substrate in both longitudinal and arcuate motions comprising:
   an electrostatic pickup for engaging the substrate at an off-center position near an edge thereof;
   a transfer arm, said electrostatic pickup positioned near a first end of said transfer arm on an upper surface thereof; and
   drive means for rotating one end of said transfer arm and thereby sweep said electrostatic pickup in an arc, and for vertically moving the transfer arm and electrostatic pickup in a longitudinal direction, wherein the electrostatic pick-up is connected to a power source by inductive coupling.

14. The apparatus of claim 13, wherein said electrostatic pickup is bipolar.

15. The apparatus of claim 13, wherein said electrostatic pickup provides sufficient pick-up force to maintain engagement of a substrate with a diameter of about three to six times the diameter of said electrostatic pickup.

16. The apparatus of claim 13, wherein a portion of said transfer arm proximal to said electrostatic pickup is comprised of an insulating material and a portion of said transfer arm proximal to said drive means is comprised of a conducting material.

17. The apparatus of claim 1, wherein said electrostatic pickup provides sufficient pick-up force to maintain engagement of a substrate with a diameter of about three to six times the diameter of said electrostatic chuck.

18. The method of claim 9, wherein the act of engaging includes engaging the article with an electrostatic pickup that is inductively coupled to a power source.

19. The method of claim 9, wherein the act of engaging the article further comprises:
   positioning the electrostatic pickup below the article;
   rotating the transfer arm to position the electrostatic pickup at a point below and off-center of the article;
   raising the electrostatic pickup to contact a lower surface of the article at an off-center position near the edge thereof; and
   energizing the electrostatic pickup to create an attraction force on the article.

20. The method of claim 12, wherein the act of positioning the electrostatic pickup includes positioning an electrostatic pickup that is connected to a power source by inductive coupling.

* * * * *

UNITED STATES PATENT AND TRADEMARK OFFICE
CERTIFICATE OF CORRECTION

PATENT NO.    : 6,354,791 B1
DATED         : March 12, 2002
INVENTOR(S)   : Wytman et al.

It is certified that error appears in the above-identified patent and that said Letters Patent is hereby corrected as shown below:

Column 7,
Line 49, please insert -- wherein -- before "said wafer".

Column 8,
Line 27, please delete "and" and insert -- an -- therefor.

Signed and Sealed this

Ninth Day of July, 2002

Attest:

Attesting Officer

JAMES E. ROGAN
Director of the United States Patent and Trademark Office